United States Patent [19]

Schouhamer Immink

[11] Patent Number: 4,536,742

[45] Date of Patent: Aug. 20, 1985

[54] METHOD OF ENCODING A STREAM OF DATA BITS, DEVICE FOR CARRING OUT THE METHOD, AND DEVICE FOR DECODING A STREAM OF DATA BITS

[75] Inventor: Kornelis A. Schouhamer Immink, Eindhoven, Netherlands

[73] Assignee: U.S. Philips Corporation, New York, N.Y.

[21] Appl. No.: 441,972

[22] Filed: Nov. 15, 1982

[30] Foreign Application Priority Data

Sep. 15, 1982 [NL] Netherlands .......................... 8203575

[51] Int. Cl.³ ............................................. H03K 13/24
[52] U.S. Cl. ............................................. 340/347 DD
[58] Field of Search ................... 340/347 DD; 360/40

[56] References Cited

U.S. PATENT DOCUMENTS

| | | | |
|---|---|---|---|
| 3,852,687 | 12/1974 | Hodges | 340/347 DD UX |
| 3,906,485 | 9/1975 | Hong | 340/347 DD |
| 4,337,458 | 6/1982 | Cohn | 340/347 DD |
| 4,413,251 | 11/1983 | Adler | 340/347 DD |

Primary Examiner—Charles D. Miller
Attorney, Agent, or Firm—Jack E. Haken; James J. Cannon, Jr.

[57] ABSTRACT

The invention relates to a method of encoding a stream of data bits of a binary source signal into a stream of data bits of a binary channel signal. The stream of data bits of the source signal is divided into a sequence of five permissible source words of variable length. Each of these five permissible source words is converted into a channel word with twice the number of data bits. This conversion has been selected in such a way that the error propagation is very small and the electronics can be very simple.

3 Claims, 4 Drawing Figures

| | $W_s$ | $W_c$ |
|---|---|---|
| $W_1$ | 0 0 0 | 1 0 0 1 0 0 |
| $W_2$ | 0 0 (1) | 0 0 0 0 |
| $W_3$ | 0 (1) | 0 0 |
| $W_4$ | 1 0 | 0 1 0 0 |
| $W_5$ | 1 1 | 1 0 0 0 |
FIG.1
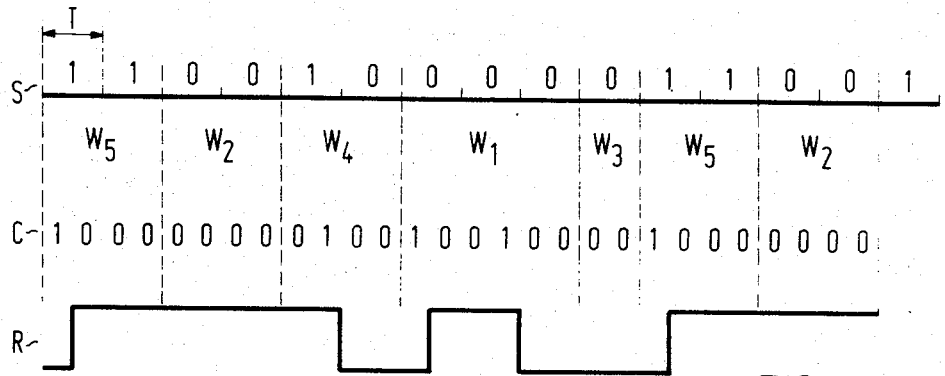
FIG.2
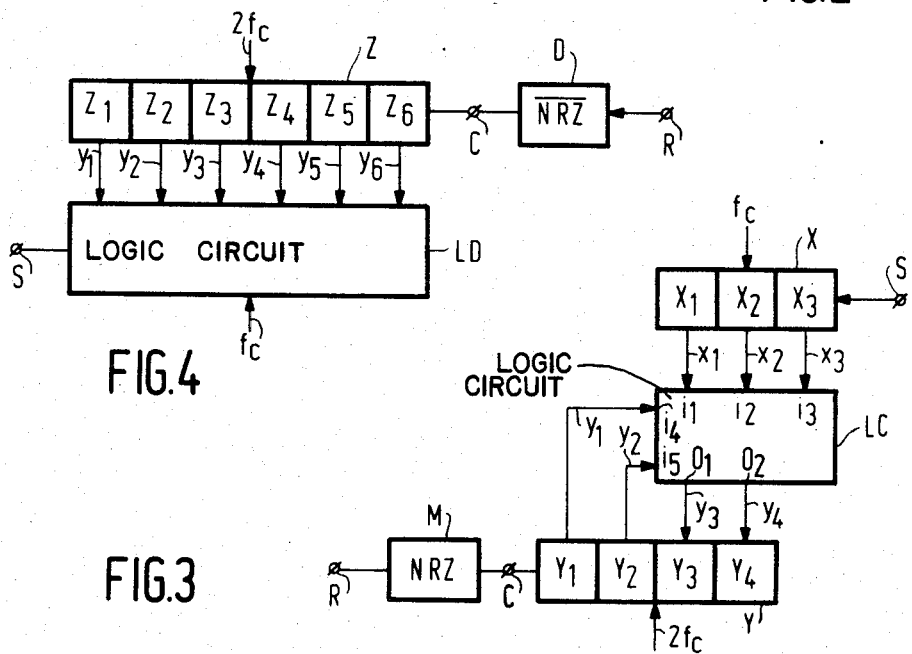
FIG.4
FIG.3

METHOD OF ENCODING A STREAM OF DATA BITS, DEVICE FOR CARRING OUT THE METHOD, AND DEVICE FOR DECODING A STREAM OF DATA BITS

BACKGROUND OF THE INVENTION

1. Field of the Invention

The invention relates to a method of encoding a stream of data bits of a binary source signal into a stream of data bits of a binary channel signal in a transmission system, in particular a system for recording and reproducing a record signal on a record carrier, the bit stream of the source signal being divided into a contiguous sequence of a limited number of permissible source words of variable length, which permissible source words are converted into corresponding channel words, each data bit of a source word resulting in two channel bits of the channel word.

2. Description of the Prior Art

When developing encoding techniques for converting a digital information signal into a binary record signal which is suitable for a specific transmission medium, for example a magnetic record carrier or an optical disc, several factors play a part. Some of these factors are:

1. The bandwidth required for the selected channel code should be compatible with the available band width of the transmission medium. This imposes an upper limit on this required bandwidth, which means that consecutive transitions between the two logic values of the binary channel signal must have at least a specific minimum spacing from each other.

2. Generally a self-clocking channel code is required, i.e. the clock signal required for decoding this channel code can be obtained from the bit stream itself, so that no separate clock synchronization words within this bit stream are needed. This limits the maximum spacing between two consecutive transitions within the channel signal.

3. The decoding time window, which is the magnitude of the time interval within which the presence or absence of a signal transition in the channel code should be detected. The requirements imposed on the transmission medium, for example the record carrier, and the associated equipment become more stringent as this time window becomes smaller.

4. Error propagation, which means that number of erroneously decoded data bits as a result of a single erroneous channel bit. The need to use error correction systems, for example the addition of parity bits, decreases as this error propagation, becomes smaller.

5. Finally, the complexity of the encoding and decoding electronics, which is obviously of great importance in the case of consumer products.

In one of the possible encoding techniques mentioned in the opening paragraph the bit stream of the source signal is divided into a contiguous sequence of a limited number of permissible source words of variable length and these source words are converted into corresponding channel words. This encoding technique is described in for IBM Journal of Research and Development, July 1970, pages 376–383. This article describes a number of codes within the scope of this encoding technique, showing that by means of this encoding technqiue conditions 1 and 2 can be satisfied and that condition 5 can be also met to an acceptable degree. However, this article also shows that this encoding technique may present error-propagation problems. Therefore, when this encoding technique is used generally additional steps are taken to reduce this error propagation, as described in U.S. Pat. No. 3,689,899. However, these steps substantially increase the equipment complexity.

SUMMARY OF THE INVENTION

The invention aims at providing a method of the type mentioned in the opening paragraph, which satisfies said conditions to a very high extent and is characterized in that the bit stream of the source signal is divided into the permissible source words specified in the following table, which source words are converted into the channel words also specified in said table:

| Source words | Channel words |
| --- | --- |
| 10 | 0100 |
| 11 | 1000 |
| 0(1) | 00 |
| 00(1) | 0000 |
| 000 | 100100 |

The principal advantage of the method in accordance with the invention is that the requirements imposed are met to a very high extent without the necessity of taking special steps which should lead to an increased equipment complexity.

Preferably, a device for carrying out the method in accordance with the invention is characterized in that the device comprises a first shift register for receiving and shifting the data bits of the source signal with a first clock frequency, a second shift register for receiving and shifting the channel bits of the channel signal with a second clock frequency equal to twice the first clock frequency, and a logic circuit for converting the permissible source words into the corresponding channel words, which logic circuit comprises three inputs which are connected to three consecutive cells $X_1$, $X_2$, $X_3$ of the first shift register, two inputs which are connected to a first and a second cell $Y_1$, $Y_2$ of the second shift register, and two outputs which are connected to a third and a fourth cell $Y_3$, $Y_4$ of the second shift register, which logic circuit is adapted to supply two logic values $Y_3$ and $Y_4$ respectively to the third and the fourth cell $Y_3$, $Y_4$ respectively of the second shift register in accordance with the following algorithm;

$$Y_3 = \overline{Y_1 Y_2} \, \{\overline{x_1 x_2 x_3} + x_1 x_2\}$$

$$Y_4 = \overline{x_2}\{\overline{x_1} y_1 + \overline{y_1 y_2} x_1\}$$

where $x_1$, $x_2$, $x_3$, $y_1$, $y_2$ are the logic values of the respective data and channel bits present in the relevant shift-register cells $X_1$, $X_2$, $X_3$, $Y_1$, $Y_2$.

A device for decoding a channel signal obtained by means of the method in accordance with the invention is characterized in that the device comprises a shift register for receiving consecutive channel bits with the clock frequency of the channel signal and a logic circuit having six inputs which are connected to six cells $Z_1$ to $Z_6$ of this shift register for receiving the logic values of six consecutive channel bits of the channel signal, and an output for supplying the source signal, the logic circuit being adapted to supply a logic value W on its output in accordance with the following algorithm:

$$W = \overline{y_1} y_4 + \overline{y_1} y_4 + y_3 \overline{y_6}$$

where $y_1$ to $y_6$ are the logic values of the channel bits in the relevant cells $Z_1$ to $Z_6$ of the shift register.

The two devices are extremely simple and are therefore eminently suitable for use in consumer equipment.

DESCRIPTION OF THE DRAWING

The invention will now be described in more detail, by way of example, with reference to the drawing, in which FIG. 1 shows the encoding rule, FIG. 2 illustrates the conversion of the bit stream of a source signal into the bit stream of a channel signal, FIG. 3 shows an embodiment of an encoding device, and FIG. 4 shows an embodiment of a decoding device.

DESCRIPTION OF THE PREFERRED EMBODIMENT

The method in accordance with the invention employs the encoding rule specified in the table in FIG. 1. In accordance with this encoding rule five permissible words $W_1$ to $W_5$ are distinguished in an applied binary source signal, which words $W_S$ have different lengths, namely the word $W_1$ a length of 3 data bits, the word $W_3$ a length of 1 data bit and the words $W_2$, $W_4$ and $W_5$ a length of 2 data bits. The 1 in parentheses in the column $W_S$ for the words $W_2$ and $W_3$ indicates that the relevant word 00 or 0 is accepted only if the data bit following this word has the logic value "1".

In order to illustrate this encoding rule FIG. 2 shows an example of a source signal S which is converted into a channel signal C in accordance with the invention. The source signal S is divided into contiguous words of the permissible types $W_1$ to $W_5$. The bit stream, which has been chosen by way of example, then results in the specified sequence of word types $W_1$ to $W_5$. Each of these source words in the bit stream is converted into the corresponding channel word $W_c$ in accordance with the table shown in FIG. 1, which results in the channel signal C shown in FIG. 2. This channel signal C is subsequently modulated in accordance with the so-called Non-Return-to-Zero (NRZ) modulation, which results in the signal R, which is then recorded on a record carrier.

This record signal R then exhibits the following properties:

1. The minimal spacing between two consecutive edges is 1.5 T, T being the length of one data bit of the source signal S.
2. The maximum spacing between two consecutive edges is 4.5 T, which is small enough to guarantee a self-clocking system.
3. The decoding time-window is 0.5 T, which is adequate to ensure a reliable operation during playback of a record carrier.

However, the great advantages of the encoding method in accordance with the invention manifest themselves in the simplicity of the encoding and decoding electronics and in the error propagation, which will be demonstrated for the encoding device described with reference to FIG. 3 and the decoding device described with reference to FIG. 4.

The encoding device shown in FIG. 3 comprises a shift register X, to whose input the source signal S is applied, which signal is shifted through this shift register with the clock frequency $f_c$, which corresponds to the bit frequency of the source signal S. This shift register X need comprise only three cells $X_1$ to $X_3$ for receiving three consecutive data bits of the source signal S. These three cells $X_1$, $X_2$, $X_3$ are connected to three inputs $i_1$, $i_2$, $i_3$ of a logic circuit LC for supplying the logic values $x_1$, $x_2$, $x_3$ of the data bits of the source signal S present in these cells.

The encoding device comprises a second shift register Y having four cells $Y_1$ to $Y_4$ in which the relevant data is shifted with the clock frequency $2f_c$. Obviously, this clock signal for the shift register Y is in synchronous with the clock signal for the shift register X. The cells $Y_1$ and $Y_2$ are connected to two inputs $i_4$ and $i_5$ of the logic circuit LC for supplying the logic values $y_1$ and $y_2$ of the channel signal bits present in these cells $Y_1$ and $Y_2$. Moreover, two outputs $o_1$ and $o_2$ of the logic circuit LC are connected to the cells $Y_3$ and $Y_4$ of the shift register Y for storing in these cells the logic values $y_3$ and $y_4$ for the relevant channel-signal bits, generated by the logic circuit LC.

Consequently, the logic circuit LC derives the logic values $y_3$ and $y_4$ for the bits in the cells $Y_3$ and $Y_4$ from the logic values $x_1$, $x_2$, $x_3$ of the data bits of the source signal in the cells $X_1$, $X_2$, $X_3$ of the shift register X and the logic values $y_1$ and $y_2$ of the bits of the channel signal in the cells $Y_1$ and $Y_2$ of the shift register Y in accordance with the following algorithms:

$$y_3 = \overline{y_1 y_2} \overline{(x_1 x_2 x_3)} + x_1 x_2$$

$$y_4 = \overline{x_2} \overline{(x_1 y_1 + y_1 y_2} x_1)$$

These two algorithms automatically yield the conversion of the source signal S into the channel signal C as indicated in FIGS. 1 and 2. Since upon application of the first three data bits of a source signal S the logic values $y_1$ and $y_2$ are still indeterminate, it is necessary to introduce a starting condition. For this purpose it suffices to load the logic value "0" into the two cells $Y_1$ and $Y_2$ of the shift register as the starting condition.

Subsequently, the channel signal C obtained on the output of the shift register Y is modulated, in known manner, in accordance with the NRZ method in the modulator M, which results in the record signal R shown in FIG. 2.

The decoding device shown in FIG. 4 firstly comprises an NRZ-demodulator D, which converts the applied record signal R shown in FIG. 2 into the channel signal C. This channel signal C is applied to a shift register Z, which needs to comprise only six cells $Z_1$ to $Z_6$, the signal being loaded into said register with the clock frequency $2f_c$. These cells $Z_1$ to $Z_6$ are connected to the inputs of a logic circuit LD for receiving the logic values $y_1$ to $y_6$ of the channel-signal bits present in these cells. From these logic values $y_1$ to $y_6$ this logic circuit LD derives the logic value X of a data bit of the source signal S in accordance with the algorithm:

$$X = \overline{y_1} y_4 + \overline{y_1} y_4 + y_3 \overline{y_6}$$

with a clock frequency $f_c$, i.e. after each shift of the bits of the channel signal C through two cells of the shift register Z. Thus, the original source signal is obtained on the output of the logic circuit LD. When this decoding technique is used the first data bit of the original source signal is not decoded. Generally, this presents hardly any problem. Moreover, if desired, this problem may be overcome simply by applying two bits of the logic value "0" to the shift register Z as a starting condition, prior to the bits of the channel signal, so that as starting condition $y_1=y_2=0$ is introduced and decoding starts with the first bit of the channel signal in cell $Z_3$ of the shift register Z.

It is to be noted that the notations "0" and "1" for the two logic values of the binary signals should not be interpreted in an absolute sense. Obviously, the logic may be inverted.

It is evident that in the decoding device shown in FIG. 4 only a sequence of 6 channel bits of the channel signal are used for decoding. This means that an erroneous channel bit results in only three erroneous data bits of the decoded signal S, so that the error propagation of the selected code is only very small.

What is claimed is:

1. A method of encoding a stream of data bits of a binary source signal into a stream of data bits of a binary channel signal in a transmission system, comprising the steps of dividing the bit stream of the source signal into a contiguous sequence of a limited number of permissible source words of variable length wherein the permissible source words are specified in the following table; converting said source words into corresponding channel words, each data bit of a source word resulting in two channel bits of the channel word, wherein said channel words are also specified in said table, and utilizing the following table in said translation:

|       | Source Word | Channel Word |
|-------|-------------|--------------|
| $W_1$ | 0 0 0       | 1 0 0 1 0 0  |
| $W_2$ | 0 0(1)      | 0 0 0 0      |
| $W_3$ | 0(1)        | 0 0          |
| $W_4$ | 1 0         | 0 1 0 0      |
| $W_5$ | 1 1         | 1 0 0 0.     |

2. A device for encoding a stream of data bits of a binary source signal into a stream of data bits of a binary channel signal in a transmission system wherein the bit stream of the source signal is divided into a contiguous segment of a limited number of permissible source words of variable length, which device converts said permissible source words into corresponding channel words wherein each data bit of a source word results in two channel bits of a channel word and wherein the permissible source words and the corresponding channel words are defined in the following table:

|       | Source Word | Channel Word |
|-------|-------------|--------------|
| $W_1$ | 0 0 0       | 1 0 0 1 0 0  |
| $W_2$ | 0 0(1)      | 0 0 0 0      |
| $W_3$ | 0(1)        | 0 0          |
| $W_4$ | 1 0         | 0 1 0 0      |
| $W_5$ | 1 1         | 1 0 0 0      | characterized in that said device comprises:

a first shift register for receiving and shifting the data bits of the source signal with a first clock frequency;

a second shift register for receiving and shifting the channel bits of the channel signal with a second clock frequency equal to twice the first clock frequency; and a logic circuit for converting the permissible source words into the corresponding channel words which logic circuit comprises three inputs which are connected to three consecutive cells $X_1$, $X_2$, $X_3$ of the first shift register, two inputs which are connected to a first and a second cell $Y_1$, $Y_2$ of the second shift register, and two outputs which are connected to a third and a fourth cell $Y_3$, $Y_4$ of the second shift register, which logic circuit is adapted to supply two logic values $y_3$ and $y_4$ respectively to the third and the fourth cell $Y_3$, $Y_4$ respectively of the second shift register in accordance with the following algorithm:

$$Y_3 = \overline{Y_1 Y_2} \overline{x_1 x_2 x_3} + x_1 x_2$$

$$Y_4 = \overline{x_2 x_1} y_1 + \overline{y_1 y_2} x_1$$

where $x_1$, $x_2$, $x_3$, $y_1$, $y_2$ are the logic values of the respective data and channel bits present in the relevant shift-register cells $X_1$, $X_2$, $X_3$, $Y_1$, $Y_2$.

3. A device for decoding a channel signal wherein said channel signal has been obtained by dividing the bit stream of a source signal into a contiguous sequence of a limited number of permissible source words of variable length which have been converted into corresponding channel words, each data bit of a source word resulting in two channel bits of the channel word and wherein said conversion has been effected in accordance with the following table:

|       | Source Word | Channel Word |
|-------|-------------|--------------|
| $W_1$ | 0 0 0       | 1 0 0 1 0 0  |
| $W_2$ | 0 0(1)      | 0 0 0 0      |
| $W_3$ | 0(1)        | 0 0          |
| $W_4$ | 1 0         | 0 1 0 0      |
| $W_5$ | 1 1         | 1 0 0 0      | characterized in that the device comprises:

a shift register for receiving consecutive channel bits with the clock frequency of the channel signal and a logic circuit having six inputs which are connected to six cells $Z_1$ to $Z_6$ of the first shift register for receiving the logic values of six consecutive channel bits of the channel signal, and an output for supplying the source signal, the logic circuit being adapted to supply a logic value W on its output in accordance with the following algorithm:

$$W = \overline{y_1} y_4 + y_1 \overline{y_4} + y_3 \overline{y_6}$$

where $y_1$ to $y_6$ are the logic values of the channel bits in the relevant cells $Z_1$ to $Z_6$ of the shift register.

* * * * *